United States Patent
Nagase

(10) Patent No.: US 7,412,359 B2
(45) Date of Patent: Aug. 12, 2008

(54) MUTUAL IMMITTANCE CALCULATION PROGRAM, MUTUAL IMMITTANCE CALCULATION APPARATUS AND METHOD, AND ELECTROMAGNETIC-FIELD STRENGTH CALCULATION PROGRAM

(75) Inventor: Kenji Nagase, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 540 days.

(21) Appl. No.: 10/285,613

(22) Filed: Nov. 1, 2002

(65) Prior Publication Data

US 2003/0187628 A1    Oct. 2, 2003

(30) Foreign Application Priority Data

Apr. 1, 2002    (JP) .............................. 2002-098862

(51) Int. Cl.
*G06F 17/10*    (2006.01)
(52) U.S. Cl. .............................. 703/2; 703/13; 703/14; 324/240; 324/260; 324/600; 438/142
(58) Field of Classification Search .............. 703/2, 703/14, 5, 13; 364/578; 702/57, 65, 40; 324/639, 240, 260, 600, 76.11; 438/142
See application file for complete search history.

(56) References Cited

U.S. PATENT DOCUMENTS

| | | | | |
|---|---|---|---|---|
| 5,313,398 | A * | 5/1994 | Rohrer et al. ................. | 703/14 |
| 5,650,935 | A * | 7/1997 | Nishino et al. ................ | 702/57 |
| 5,812,434 | A * | 9/1998 | Nagase et al. ................. | 703/2 |
| 5,940,310 | A * | 8/1999 | Yamaguchi et al. ............. | 703/4 |
| 5,966,524 | A * | 10/1999 | Burnett et al. ................. | 703/5 |
| 6,182,023 | B1 * | 1/2001 | Ohtsu et al. ................... | 703/5 |
| 6,185,517 | B1 * | 2/2001 | Ohtsu et al. ................... | 703/4 |
| 6,285,957 | B1 * | 9/2001 | Tanaka et al. ................. | 702/57 |
| 6,289,298 | B1 * | 9/2001 | Belk ............................. | 703/5 |
| 6,353,801 | B1 * | 3/2002 | Sercu et al. ................... | 702/65 |
| 6,397,171 | B1 * | 5/2002 | Belk ............................ | 703/14 |
| 6,456,949 | B1 * | 9/2002 | Yamagajo et al. ............. | 702/65 |
| 6,523,154 | B2 * | 2/2003 | Cohn et al. .................... | 716/6 |

(Continued)

FOREIGN PATENT DOCUMENTS

JP    08-304492    11/1996

(Continued)

OTHER PUBLICATIONS

N. Wang, J. Richmond, M. Gilreath, Sinusoidal reaction formulation for radiation and scattering from conducting surfaces, 1973 IEEE, pp. 376-382.*

(Continued)

*Primary Examiner*—Hugh Jones
*Assistant Examiner*—Kibrom K Gebresilassie
(74) *Attorney, Agent, or Firm*—Staas & Halsey LLP

(57) ABSTRACT

In a mutual immittance calculation apparatus, an input section inputs data of a model of an electric circuit apparatus, being a target for analysis of the electromagnetic-field strength and being divided into a plurality of patches. A mutual immittance calculation section calculates respective mutual immittance for combinations of patches corresponding to the main portion and to the additional portion. The mutual immittance calculation section uses a stored calculation result corresponding to the main portion when the model in which only the additional portion has been changed is calculated for a second time onward, and recalculates the mutual immittance corresponding to the changed additional portion.

8 Claims, 13 Drawing Sheets

U.S. PATENT DOCUMENTS

| | | | |
|---|---|---|---|
| 6,555,998 B1 * | 4/2003 | Kishimoto et al. | 324/76.11 |
| 6,691,076 B1 * | 2/2004 | Nagase et al. | 703/2 |
| 6,711,511 B2 * | 3/2004 | Nagase et al. | 702/65 |
| 6,766,261 B2 * | 7/2004 | Nishino et al. | 702/65 |
| 6,834,380 B2 * | 12/2004 | Khazei | 716/10 |
| 6,845,351 B1 * | 1/2005 | Kishimoto et al. | 703/14 |
| 6,931,334 B2 * | 8/2005 | Yoshida et al. | 702/65 |
| 7,149,666 B2 * | 12/2006 | Tsang et al. | 703/2 |
| 7,222,033 B1 * | 5/2007 | Newson et al. | 702/65 |
| 2002/0140435 A1 * | 10/2002 | Nishino et al. | 324/627 |
| 2005/0057412 A1 * | 3/2005 | Hwang et al. | 343/767 |

FOREIGN PATENT DOCUMENTS

| | | |
|---|---|---|
| JP | 9-245076 A | 9/1997 |
| JP | 11-038059 | 2/1999 |
| JP | 2001-013184 | 1/2001 |
| JP | 2001-188075 A | 7/2001 |

OTHER PUBLICATIONS

U.S. Appl. No. 09/537,352, filed Mar. 29, 2000, Tanaka Yoshiro, et al., Fujitsu Limited.

Partial English Translation of Japanese Office Action dated Apr. 10, 2007 in Application No. 2002-098862.

* cited by examiner

200a: MAIN PORTION
200b: ADDITIONAL PORTION

WHEN ADDITIONAL PORTION IS CHANGED, ONLY MUTUAL IMMITANCE OF RELEVANT MODE (18 TO 24) IS RECALCULATED $Z_{I,J}$ INDICATES MUTUAL IMMITANCE RELATING TO MODE i (1 TO 24) AND MODE j (1 TO 24)

200a: MAIN PORTION
200b': ADDITIONAL PORTION

FIG.3

$$\begin{pmatrix} Z_{1,1} & Z_{1,2} & Z_{1,3} & \cdots & Z_{1,17} & Z_{1,18} & \cdots & Z_{1,24} \\ Z_{2,1} & Z_{2,2} & Z_{2,3} & \cdots & Z_{2,17} & Z_{2,18} & \cdots & Z_{2,24} \\ \vdots & & & & & & & \vdots \\ & \boxed{\text{X REGION}} & & & & \boxed{\text{Y REGION}} & & \\ \vdots & & & & & & & \vdots \\ Z_{17,1} & Z_{17,2} & Z_{17,3} & \cdots & Z_{17,17} & Z_{17,18} & \cdots & Z_{17,24} \\ Z_{18,1} & Z_{18,2} & Z_{18,3} & \cdots & Z_{18,17} & Z_{18,18} & \cdots & Z_{18,24} \\ \vdots & & & & & \boxed{\text{Z REGION}} & & \\ Z_{24,1} & Z_{24,2} & Z_{24,3} & \cdots & Z_{24,17} & Z_{24,18} & \cdots & Z_{24,24} \end{pmatrix} \begin{pmatrix} I_1 \\ I_2 \\ \vdots \\ \vdots \\ \vdots \\ I_{17} \\ I_{18} \\ \vdots \\ \vdots \\ I_{24} \end{pmatrix} = \begin{pmatrix} V_1 \\ V_2 \\ \vdots \\ \vdots \\ \vdots \\ V_{17} \\ V_{18} \\ \vdots \\ \vdots \\ V_{24} \end{pmatrix}$$

MUTUAL IMMITANCE — CURRENT — WAVE SOURCE

MAIN PORTION ← → ADDITIONAL PORTION

MAIN PORTION ←

MAIN PORTION ← → ADDITIONAL PORTION

MODEL DEFINING MAIN PORTION AND ADDITIONAL PORTION FOR THE FIRST TIME

MODEL WHICH IS CHANGED FOR SECOND TIME ONWARD p*: POINT NUMBER
q*: PATCH NUMBER
e*: EDGE NUMBER

| EDGE NUMBER | POINT NUMBER 1 | POINT NUMBER 2 | PATCH NUMBER 1 | PATCH NUMBER 2 |
|---|---|---|---|---|
| 1 | 2 | 1 | 1 | 0 |
| 2 | 1 | 4 | 1 | 0 |
| 3 | 4 | 5 | 1 | 2 |
| 4 | 5 | 2 | 1 | 3 |
| 5 | 4 | 7 | 2 | 0 |
| 6 | 7 | 8 | 2 | 0 |
| 7 | 8 | 5 | 2 | 4 |
| 8 | 3 | 2 | 3 | 0 |
| 9 | 5 | 6 | 3 | 4 |
| 10 | 6 | 3 | 3 | 0 |
| 11 | 8 | 9 | 4 | 0 |
| 12 | 9 | 6 | 4 | 0 |

| AB RATIO | 1:1 | 5:1 | 10:1 | 20:1 | 50:1 | 100:1 |
|---|---|---|---|---|---|---|
| RATIO BETWEEN COMBINATION NUMBERS | 1.0 | 0.286 | 0.167 | 0.0909 | 0.0385 | 0.0196 |

MUTUAL IMMITTANCE CALCULATION PROGRAM, MUTUAL IMMITTANCE CALCULATION APPARATUS AND METHOD, AND ELECTROMAGNETIC-FIELD STRENGTH CALCULATION PROGRAM

BACKGROUND OF THE INVENTION

1) Field of the Invention

The present invention relates to a technology for calculating mutual immittance in an electric circuit apparatus and mutual immittance used to calculate an electromagnetic-field strength, based on a moment method.

2) Description of the Related Art

Conventionally, a radio wave that is unnecessarily emitted from an electric circuit apparatus interferes with other radio waves such as TV and radio, and hence it is strictly restricted in each country. In order to satisfy such restriction of radio waves, it is necessary to use various technologies as solutions to this problem such as shield engineering and filter technology. Further, a technology that quantitatively simulates how much these technologies can reduce the radio wave is required.

Huge amount of processing time is necessary for a computer to simulate such an electromagnetic wave analysis, and hence an apparatus that computes the strength of an electromagnetic field emitted from the electric circuit apparatus at a high speed is required.

The strength of an electromagnetic field emitted from an arbitrarily shaped object can be easily calculated by using a known theoretical formula if the current flowing through each section of the object is known. Theoretically, if the Maxwell's electromagnetic wave equation is solved under a given boundary condition, a current value can be obtained. However, at present, solutions to the equation to be directly obtained under a complicated boundary condition targeting an arbitrarily shaped object has not been known yet.

Therefore, all the solutions for determining the current, used in the electromagnetic-field strength calculation apparatus are approximate, though the degree of difficulty is different. The moment method is currently known as a representative of the approximate solutions.

The moment method is one of the solutions to an integral equation derived from the Maxwell's electromagnetic wave equation, and this method can handle a three-dimensional arbitrarily shaped object. More specifically, the object is divided into small elements to calculate a current.

As described above, since the moment method can handle a three-dimensional arbitrarily shaped object, a configuration in which the strength of an electromagnetic field emitted from the electric circuit apparatus is calculated by using the moment method is prevailing in the electromagnetic-field strength calculation apparatus.

When the moment method is used, such a method is employed that when a metal object is handled, the metal portion is formed into a mesh, as a target for analysis, to obtain a mutual immittance $Z_{i,j}$ between the divided metals, and simultaneous equations $[Z_{i,j}] [I_i]=[V_i]$ in the moment method established between the mutual immittance $Z_{i,j}$, a wave source $V_i$ and a current $I_i$ flowing in the divided metal is solved to obtain a current $I_i$, and the electromagnetic-field strength to be emitted is calculated from this result. A symbol [ ] denotes a matrix.

One of references relating to the moment method is as follows.

[Reference 1] H. N. Wang, J. H. Richmond and M. C. Gilreath: "Sinusoidal reaction formulation for radiation and scattering from conducting surface", IEEE TRANSACTIONS ON ANTENNAS AND PROPAGATION, vol. AP-23, 1975.

When an electromagnetic wave is analyzed with respect to an actual machine (electric circuit apparatus), generally, an analogous model is repeatedly analyzed, while changing a part of the analysis model.

In the conventional electromagnetic-field strength calculation apparatus, as described above, even if the analysis model is slightly changed, mutual immittance is calculated for combinations of all elements, which requires huge calculation amounts. The calculation of the mutual immittance accounts for nearly half the time required for the electromagnetic analysis.

Therefore, when the electromagnetic wave analysis is performed with respect to the actual machine, the calculation amount becomes huge by the number of times of changing the part of the analysis model, causing a problem in that even several hours to tens of hours are required.

SUMMARY OF THE INVENTION

It is an object of this invention to provide a mutual immittance calculation program, a mutual immittance calculation apparatus, a mutual immittance calculation method, and an electromagnetic-field strength calculation program that enable high speed calculation by reducing the calculation amounts.

The mutual immittance calculation program according to one aspect of this invention, makes a computer function as an input unit that inputs data of a model of an electric circuit apparatus, being a target for analysis of the electromagnetic-field strength and being divided into a plurality of patches, a discrimination unit that discriminates a main portion from an additional portion in the patches, a mutual immittance calculation unit that calculates the mutual immittance for combinations of patches corresponding to the main portion and calculates the mutual immittance for combinations of patches corresponding to the additional portion, and a storage unit that stores a result of calculating the mutual immittance corresponding to the main portion. The mutual immittance calculation unit uses the calculation result stored at the storage unit when the model in which only the additional portion has been changed is calculated for a second time onward, and recalculates the mutual immittance corresponding to the changed additional portion.

The mutual immittance calculation apparatus according to another aspect of this invention, comprises an input unit that inputs data of a model of an electric circuit apparatus, being a target for analysis of the electromagnetic-field strength and being divided into a plurality of patches, a discrimination unit that discriminates a main portion from an additional portion in the patches, a mutual immittance calculation unit that calculates the mutual immittance for combinations of patches corresponding to the main portion and calculates the mutual immittance for combinations of patches corresponding to the additional portion, and a storage unit that stores a result of calculating the mutual immittance corresponding to the main portion. The mutual immittance calculation unit uses the calculation result stored at the storage unit when the model in which only the additional portion has been changed is calculated for a second time onward, and recalculates the mutual immittance corresponding to the changed additional portion.

The mutual immittance calculation method according to still another aspect of this invention, comprises steps of inputting data of a model of an electric circuit apparatus, being a target for analysis of the electromagnetic-field strength and being divided into a plurality of patches, discriminating a main portion from an additional portion in the patches, calculating the mutual immittance for combinations of patches corresponding to the main portion and calculating the mutual immittance for combinations of patches corresponding to the additional portion, and storing a result of calculating the mutual immittance corresponding to the main portion. The mutual immittance calculating step includes using the calculation result stored at the storing step when the model in which only the additional portion has been changed is calculated for a second time onward, and recalculating the mutual immittance corresponding to the changed additional portion.

The electromagnetic-field strength calculation program according to still another aspect of this invention, makes a computer function as an input unit that inputs data of a model of an electric circuit apparatus, being a target for analysis of the electromagnetic-field strength and being divided into a plurality of patches, a discrimination unit that discriminates a main portion from an additional portion in the patches, a mutual immittance calculation unit that calculates the mutual immittance for combinations of patches corresponding to the main portion and calculates the mutual immittance for combinations of patches corresponding to the additional portion, a storage unit that stores a result of calculating the mutual immittance corresponding to the main portion, and an electromagnetic-field strength calculation unit that calculates the electromagnetic-field strength, based on the calculation result of the mutual immittance. The mutual immittance calculation unit uses the calculation result stored at the storage unit when the model in which only the additional portion has been changed is calculated for a second time onward, and recalculates the mutual immittance corresponding to the changed additional portion.

These and other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 3 is a diagram showing simultaneous equations in the moment method.

DETAILED DESCRIPTION

One embodiment of the mutual immittance calculation program, the mutual immittance calculation apparatus, the mutual immittance calculation method, and the electromagnetic-field strength calculation program according to the present invention will be explained in detail below with reference to the drawings.

Figure 1:
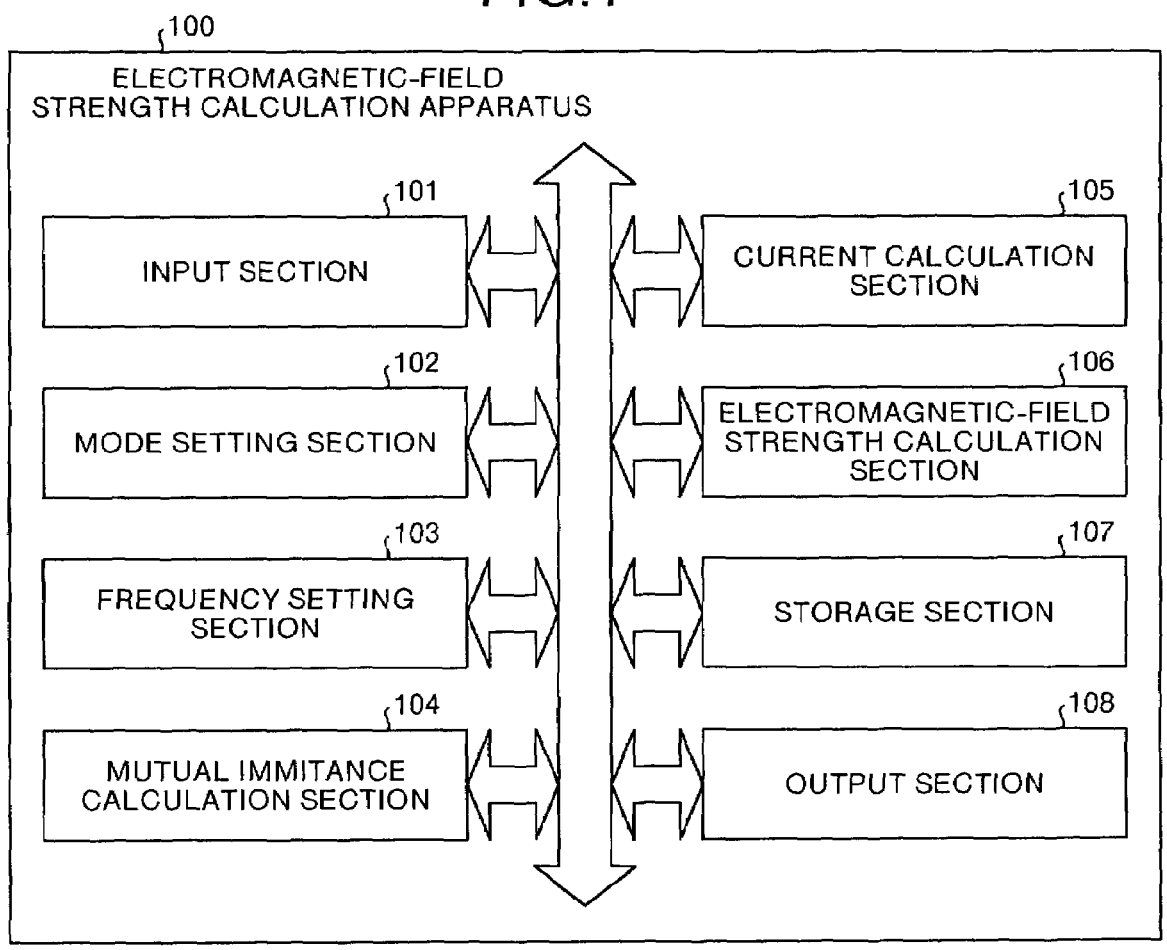
FIG. 1 is a block diagram showing the configuration of one embodiment of the present invention.

FIG. 1 is a block diagram showing the configuration of one embodiment of the present invention. In this figure, an electromagnetic-field strength calculation apparatus 100 calculates electromagnetic-field strength of a model formed in a mesh by designating a metal portion as a target for analysis using the moment method. More specifically, a current $I_i$ of the model is obtained by solving a simultaneous equations $[Z_{i,j}]$ $[I_i]=[V_i]$ in the moment method established between a mutual immittance $Z_{i,j}$ between the divided metals, a wave source $V_i$, and a current $I_i$ flowing in the divided metal, and the strength of the electromagnetic field to be emitted is calculated from this result.

Figure 2A:
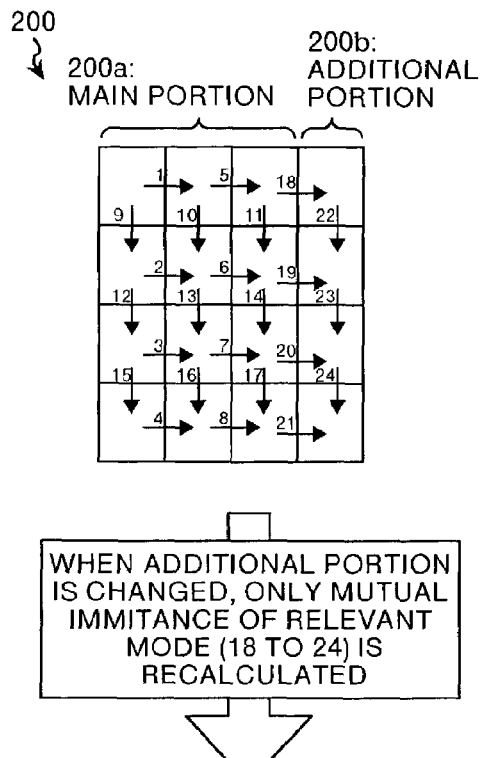
FIG. 2A to FIG. 2C are diagrams showing the operation principle in the embodiment.

The operation principle of the embodiment will be explained with reference to FIGS. 2A to 2C to FIG. 5. FIG. 2A shows a model 200 formed in a mesh. In this model 200, an additional portion 200b is added to a main portion 200a. When the analysis of the model 200 is finished, the model 200 is changed to a model 200' shown in FIG. 2C. In this model 200', there is no change in the main portion 200A, but the additional portion 200b is changed to an additional portion 200b'.

In this embodiment, each area obtained by being divided in a mesh (quadrangle or triangle) is referred to as a patch, the sides forming the patch are respectively referred to as an edge, and the end of the edge is referred to as a point.

A mutual immittance matrix $[Z_{i,j}]$ (see FIG. 2B) between dipoles numbered 1 to 24 as shown in the figure, with respect to each patch of the model 200 shown in FIG. 2A will be considered.

Figure 4A:
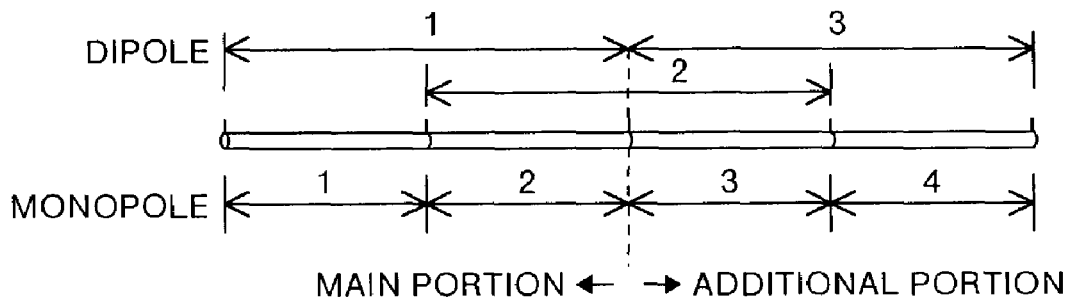
FIG. 4A to FIG. 4C are diagrams showing the operation principle in the embodiment.

The dipole is formed of two monopoles as shown in FIG. 4A. In this figure, for example, a dipole 1 is formed of a monopole 1 and a monopole 2. One monopole is associated with one patch. Therefore, the dipole consisting of two monopoles is associated with adjacent two patches so as to extend over two patches.

In FIG. 4A, when an additional portion (patch) is added to the main portion (patch), monopoles 3 and 4 corresponding to the additional portion are added, and the dipoles 2 and 3 are also added. In this case, when calculating the mutual immittance between the dipoles, it becomes a problem that which of the main element and the additional element corresponds to any of the dipoles 1 to 3.

Figure 4B:
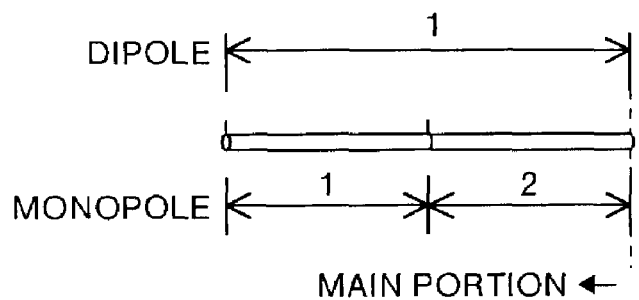

Of the dipoles 1 to 3 shown in FIG. 4A, the dipole 1 shown in FIG. 4B is formed of the monopoles 1 and 2 corresponding to the main portion, and hence the dipole 1 is the main element. Of the dipoles 1 to 3 shown in FIG. 4A, the dipole 3 shown in FIG. 4C is formed of the monopoles 3 and 4 corresponding to the additional portion, and hence the dipole 3 is the additional element.

Figure 4C:
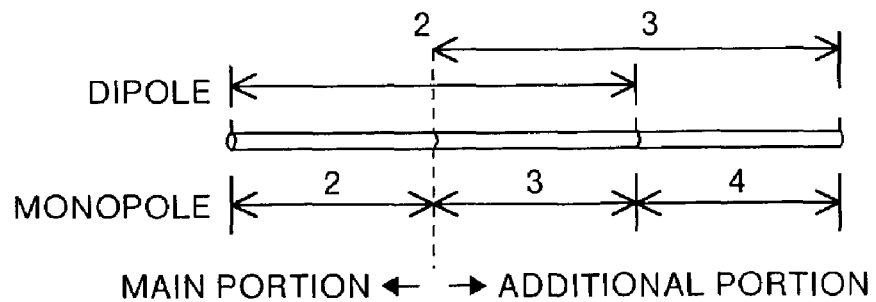

On the other hand, the dipole 2 shown in FIG. 4C is formed with the monopole 2 corresponding to the main portion and the monopole 3 corresponding to the additional portion. Hence, the main element and the additional element cannot be discriminated from each other from the dipole 2. Therefore, in this embodiment, the dipole 2 is handled as the additional element.

Figure 2B:
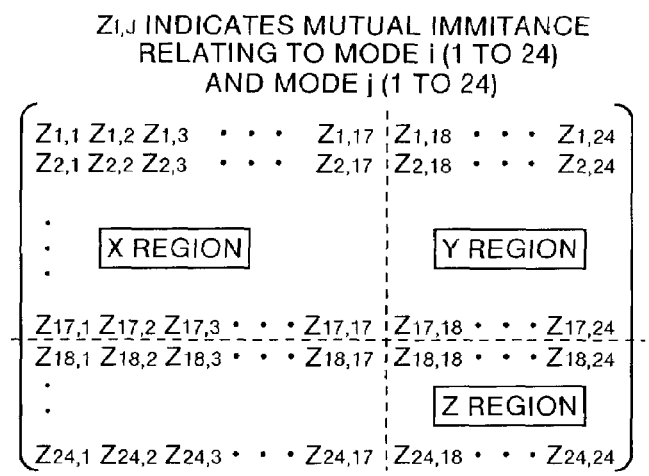

The mutual immittance matrix $[Z_{i,j}]$ is a determinant consisting of elements (mutual immittance $Z_{i,j}$) of i row (1 to 24)×j column (1 to 24), as shown in FIG. 2B, and is used for the simultaneous equations in the moment method shown in FIG. 3. Hereinafter, i and j are referred to as a mode.

In the simultaneous equations $[Z_{i,j}][I_i]=[V_i]$, wave sources $V_1$ to $V_{24}$ are given as known values to calculate the mutual immittance $Z_{1,1}$ to $Z_{24,24}$ and current $I_1$ to $I_{24}$.

For example, $Z_{1,1}$ is a mutual immittance between the dipole 1 and the dipole 1 shown in FIG. 2A. $Z_{1,2}$ is a mutual immittance between the dipole 1 and the dipole 2 shown in FIG. 2A. In the same manner hereinafter, $Z_{24,24}$ is a mutual immittance between the dipole 24 and the dipole 24 shown in FIG. 2A.

Figure 2C:
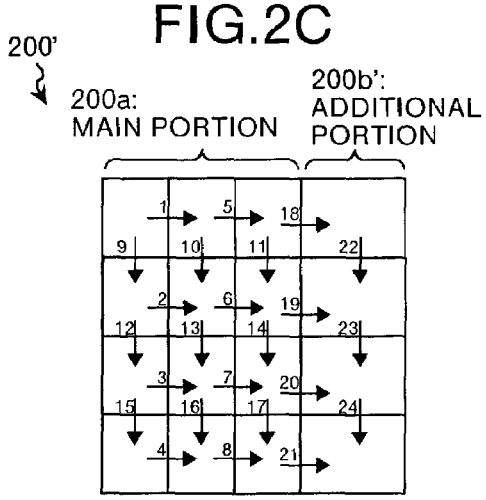

The mutual immittance matrix $[Z_{i,j}]$, when the model as a target for analysis is changed from the model 200 shown in FIG. 2A to the model 200' shown in FIG. 2C will be considered. In the model 200', the main portion 200a is not changed, but the additional portion 200b' is changed.

Figure 5:
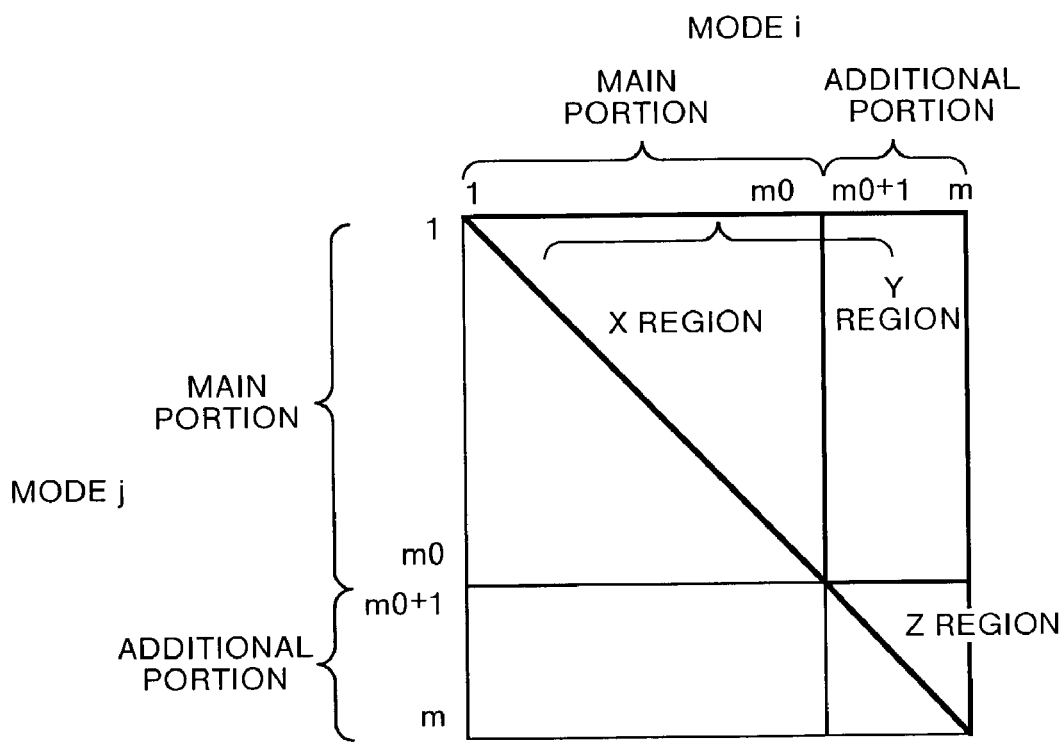
FIG. 5 is a diagram showing the operation principle in the embodiment.

In the mutual immittance matrix $[Z_{i,j}]$ shown in FIG. 2C, $Z_{1,1}$ to $Z_{17,17}$ correspond to the combination of the dipoles 1 to 17 in the main portion 200a shown in FIG. 2A and FIG. 2C. FIG. 5 diagrammatically represents the array (mode i(1 to m), mode j (1 to m)) of the mutual immittance matrix $[Z_{i,j}]$.

Therefore, the X region shown in FIG. 5 corresponds to $Z_{1,1}$ to $Z_{17,17}$ shown in FIG. 2B, and does not change before and after the model change.

On the other hand, the Y region (see FIG. 5) shown in FIG. 2B corresponds to a combination of dipoles 1 to 17 in the main portion 200a and dipoles 18 to 24 in the additional portion 200b (or additional portion 200b') shown in FIG. 2A and FIG. 2C, and changes before and after the model change.

The Z region (see FIG. 5) shown in FIG. 2B corresponds to a combination of dipoles 18 to 24 in the additional portion 200b (or additional portion 200b') shown in FIG. 2A and FIG. 2C, and changes before and after the model change.

In this manner, in the mutual immittance matrix $[Z_{i,j}]$, the X region does not change but the Y region and the Z region change before and after the model change. In this embodiment, this point is paid attention. The calculation result of the mutual immittance in the X region that does not change is stored, and every time the model is changed, the calculation result is read out, and by recalculating only the mutual immittance of the Y region and the Z region which have changed, the overall calculation amount is reduced.

Figure 9A:
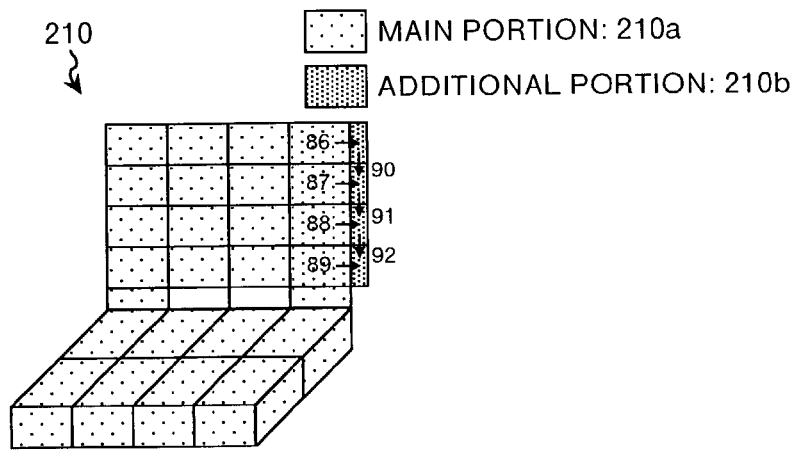
Figure 10A:
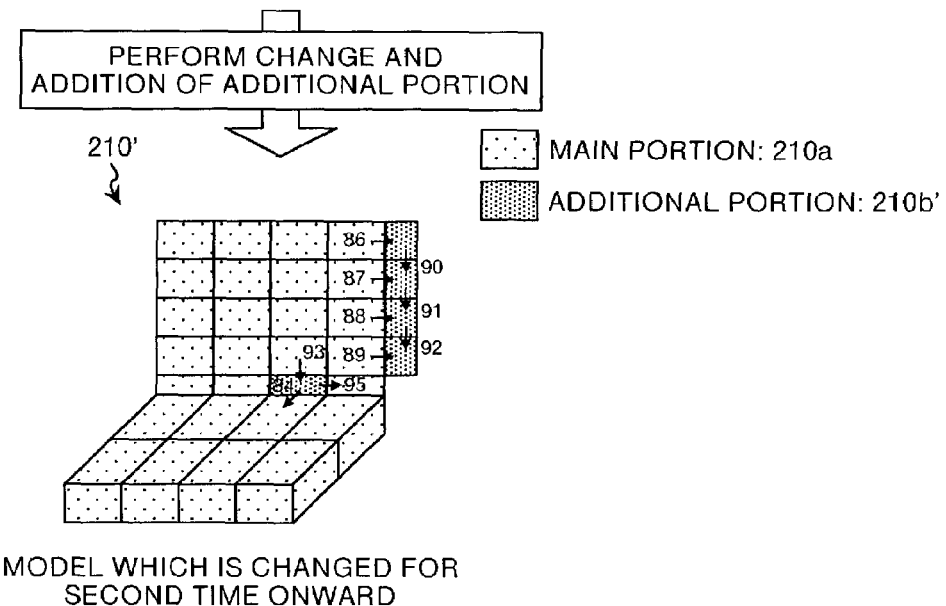

In FIG. 1, an input section 101 inputs model data relating to, for example, a model 210 formed in a mesh shown in FIG. 9A and a model 210' formed in a mesh shown in FIG. 10A. Here, the models 210 and 210' shown in FIG. 9A and FIG. 10A correspond to the shape of a notebook-sized personal computer, and divided into patches in a mesh.

A mode setting section 102 shown in FIG. 1 has a function of setting the modes in order to separate the mutual immittance matrix $[Z_{i,j}]$ into the X region, Y region, and Z region, as shown in FIG. 5. An algorithm of this mode setting will be described later. A frequency setting section 103 has a function of setting a predetermined frequency when the mutual immittance is calculated.

A mutual immittance calculation section 104 has a function of calculating each mutual immittance $Z_{i,j}$ in the mutual immittance matrix $[Z_{1,j}]$. A current calculation section 105 has a function of calculating the current $I_i$ by solving the simultaneous equations $[Z_{i,j}][I_i]=[V_i]$ shown in FIG. 3.

An electromagnetic-field strength calculation section 106 has a function of calculating the electromagnetic-field strength to be emitted, based on the current $I_1$. A storage section 107 stores the calculation result of the mutual immittance $Z_{i,j}$ corresponding to the X region (see FIG. 5). An output section 108 has a function of outputting the calculation result of the electromagnetic-field strength.

The operation in this embodiment will now be explained with reference to the flowcharts shown in FIG. 6 to FIG. 8, and with reference to FIGS. 9A and 9B to FIGS. 13A and 13B. An example will be explained below, in which after calculation of the electromagnetic-field strength is performed for the first time around, designating the model 210 shown in FIG. 9A as a target for the analysis, calculation of the electromagnetic-field strength is performed for the second time onward, designating the model 210' shown in FIG. 10A as a target for the analysis.

In the model 210 shown in FIG. 9A, an additional portion 210b is added to a main portion 210a. When the analysis of the model 210 is finished, the model 210 is changed to the model 210' shown in FIG. 10A. The main portion 210a of this model 210' is not changed, but the additional portion 210b is changed to the additional portion 210b'.

Figure 6:
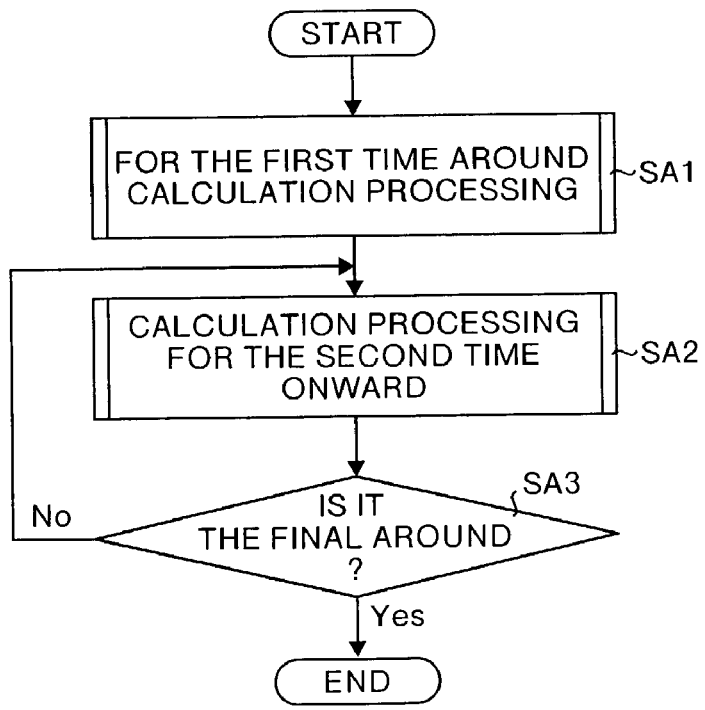
FIG. 6 is a flowchart showing the operation in the embodiment.

At step SA1 shown in FIG. 6, a calculation for the first time around is executed. Specifically, at step SB1 shown in FIG. 7, the input section 101 inputs model data representing the model 210 (the main portion 210a, the additional portion 210b) shown in FIG. 9A.

At step SB2, the mode setting section 102 creates an edge table for the model 210. This edge table represents the correspondence between the edges, points, and patches which constitute the model as shown in FIG. 11B.

Figures 11A, 11B:
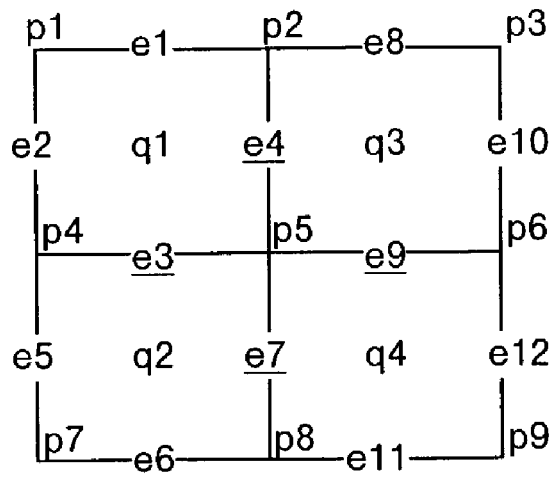
Figure 12:
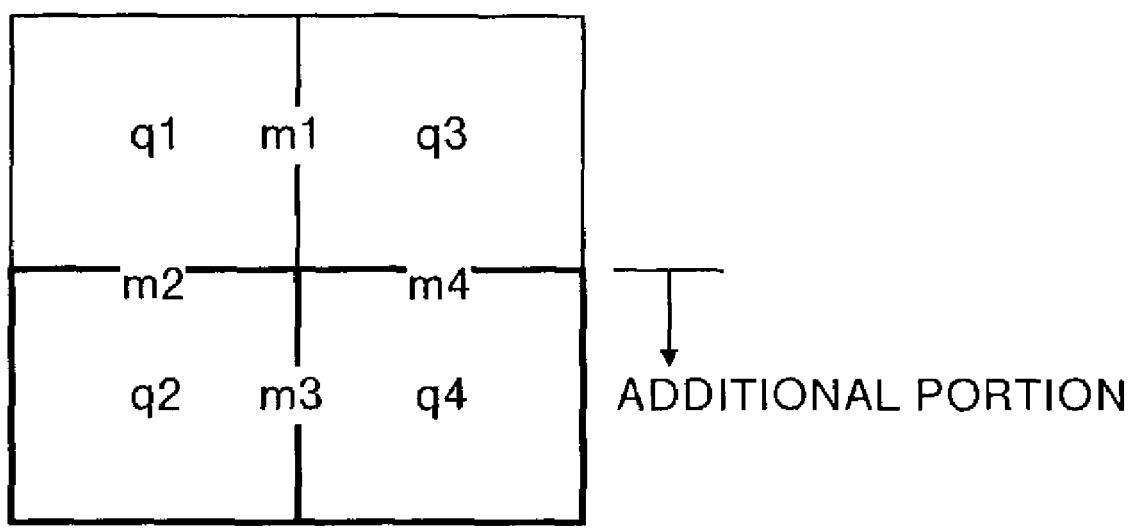
FIG. 12 is a diagram showing mode setting in the embodiment.

In order to simplify the explanation, an example that an edge table corresponding to a model consisting of four patches shown in FIG. 11A is created will be explained below. In FIG. 11A, reference signs p1 to p9 respectively represent a point number corresponding to each point, being a corner of each patch. Reference signs q1 to q4 respectively represent a patch number corresponding to each patch. Reference signs e1 to e12 respectively represents an edge number corresponding to an edge (side) connecting the points.

In the above model, the patches corresponding to the patch numbers q1 and q3 form the main portion, and the patches corresponding to the patch numbers q2 and q4 form the additional portion.

The mode setting section 102 registers the smallest edge number in the model (in this case, e1) in "edge number" of the edge table for the model shown in FIG. 11B. In the edge table, however, only a number is registered respectively in "edge number", "point number 1", "point number 2", "patch number 1", and "patch number 2" (e, p, and q are omitted).

The mode setting section 102 then registers the point numbers (in this case, p2, p1) indicating the opposite ends of the edge corresponding to the edge number (in this case, e1) registered in the "edge number", in the "point number 1" and "point number 2", respectively. The mode setting section 102 then registers the patch number (in this case, q1) of the patch including the edge (when there are two, one having a smaller patch number) corresponding to the edge number (in this case, e1) registered in the "edge number", in the "patch number 1".

When there are two patches such that the edge is between the two patches, the patch number that is not registered in the "patch number 1", is registered in the "patch number 2". On the other hand, if there is only one patch including the relevant edge, 0 is registered in the "patch number 2".

When the registration of numbers in the "edge number", "point number 1", "point number 2", "patch number 1", and "patch number 2" is finished, registration of the next edge number (in this case, e2) to the last edge number (in this case, e12) is sequentially executed, to thereby create the edge table.

Figure 7:
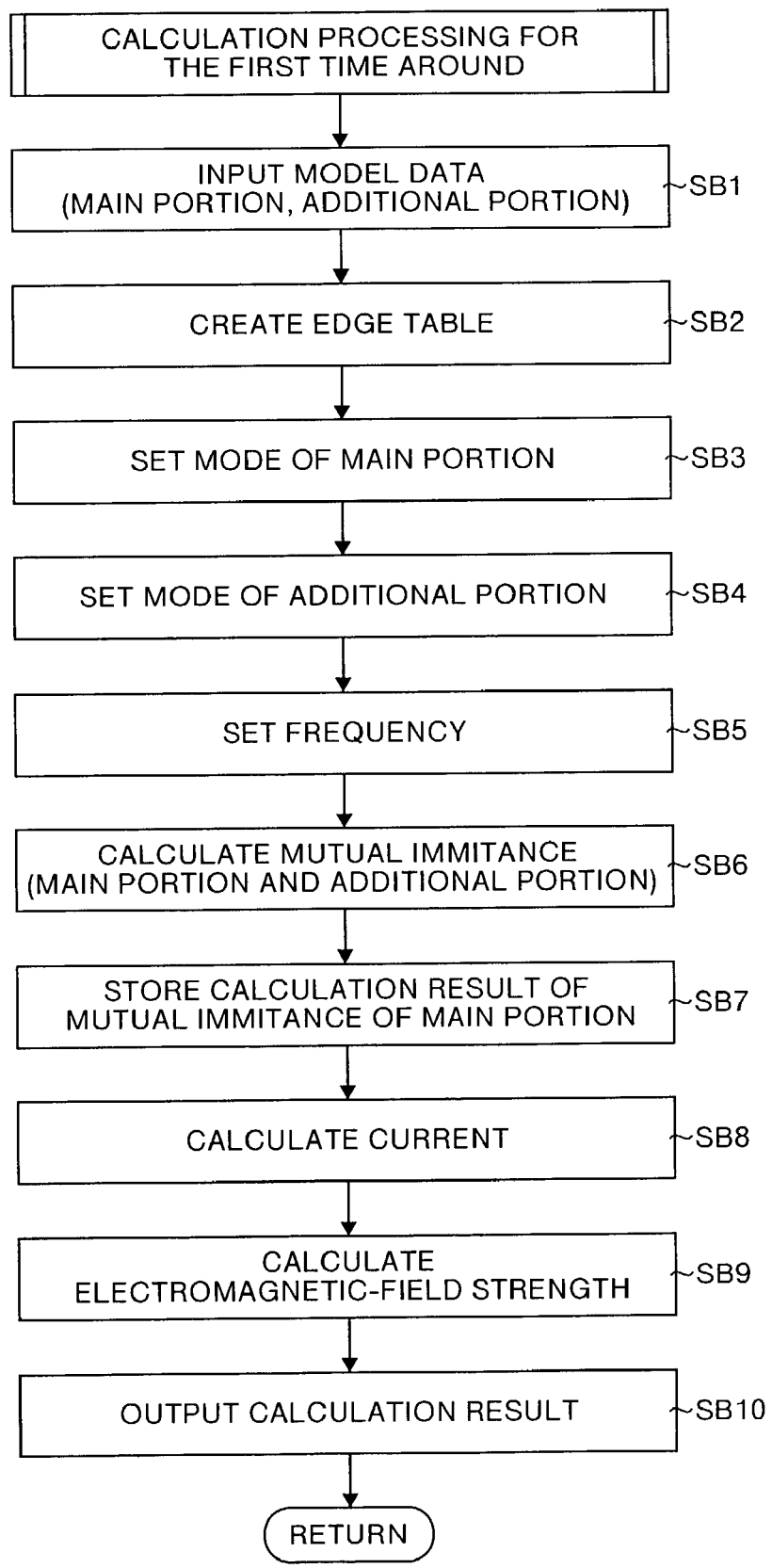
FIG. 7 is a flowchart showing the calculation processing for the first time around shown in FIG. 6.
Figure 8:
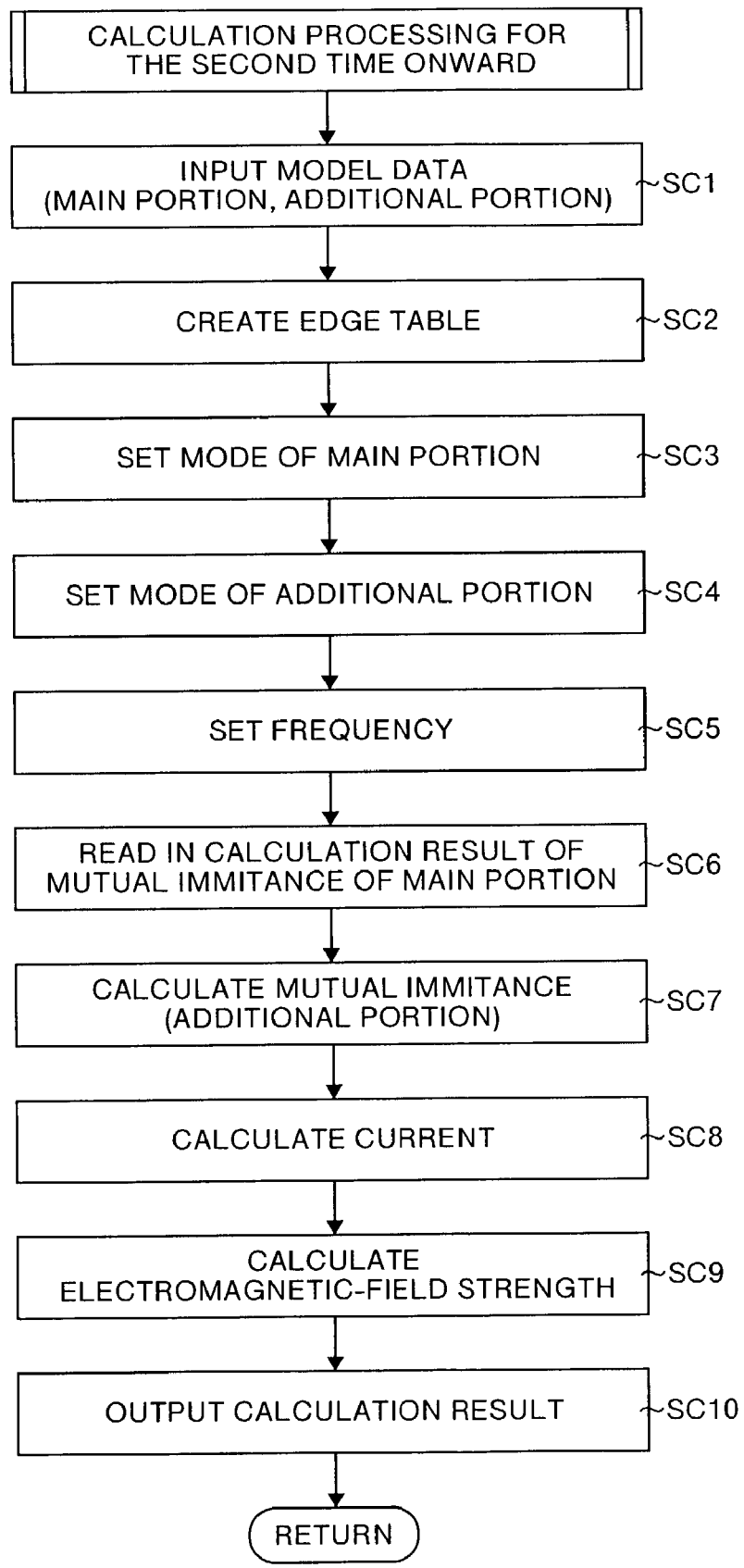
FIG. 8 is a flowchart showing the calculation processing for the second time onward shown in FIG. 6, FIG. 9A and FIG. 9B are diagrams showing the calculation processing for the first time around shown in FIG. 7, FIG. 10A and FIG. 10B are diagrams showing the calculation processing for the second time onward shown in FIG. 8, FIG. 11A and FIG. 11B are diagrams showing mode setting in the embodiment.

At step SB3 shown in FIG. 7, the mode setting section 102 checks whether patch numbers other than 0 are registered in both of the "patch number 1" and "patch number 2", in the ascending order of the edge number of the edge table created at step SB2. When the numbers are thus registered, the mode of the main portion is set. This mode corresponds to the mode i (main portion) and the mode j (main portion) shown in FIG. 5.

However, of the two patch numbers (other than 0) registered in the "patch number 1" and "patch number 2", when at least one patch number represents the patch of the additional portion, the mode setting section 102 does not set the mode.

More specifically, in the example of the edge table shown in FIG. 11B, when the "edge number" is 3, patch numbers are registered in both of the "patch number 1"=1 and "patch number 2"=2, but since the patch corresponding to the "patch number"=2 is the additional portion, the mode (main portion) is not set.

On the other hand, when the "edge number" is 4, patch numbers are registered in both of the "patch number 1"=1 and "patch number 2"=3, and the both patches (p1, p3) corresponding to the both patch numbers are not the additional portions, and hence m1 (see FIG. 12) is set as the mode.

This m1 corresponds to the mode i (=1) and the mode j (=1) shown in FIG. 5. The mode of the main portion is sequentially set hereinafter. The mode set at the last time in the main portion corresponds to the mode i (=m0) and the mode j (=m0) shown in FIG. 5.

At step SB4 shown in FIG. 7, the mode setting section 102 sets the mode of the additional portion. Specifically, the mode setting section 102 sequentially sets the mode of the additional portion in ascending order of the edge number, with respect to each edge number. This edge number has the patch numbers other than 0 that are registered in both of the "patch number 1" and "patch number 2" of the edge table shown in FIG. 11B but has not the mode of the main portion that is set.

In the example of the edge table shown in FIG. 11B, when "edge number"=3, patch numbers are registered in both of the "patch number 1"=1 and "patch number 2"=2, and the mode of the main portion is not set, and hence m2 (see FIG. 12) is set as the mode (additional portion).

This m2 corresponds to the mode i (=m0+1) and the mode j (=m0+1) shown in FIG. 5. The mode of the additional portion is sequentially set hereinafter. The mode set at the last time in the additional portion corresponds to the mode i (=m) and the mode j (=m) shown in FIG. 5.

Figure 9B:
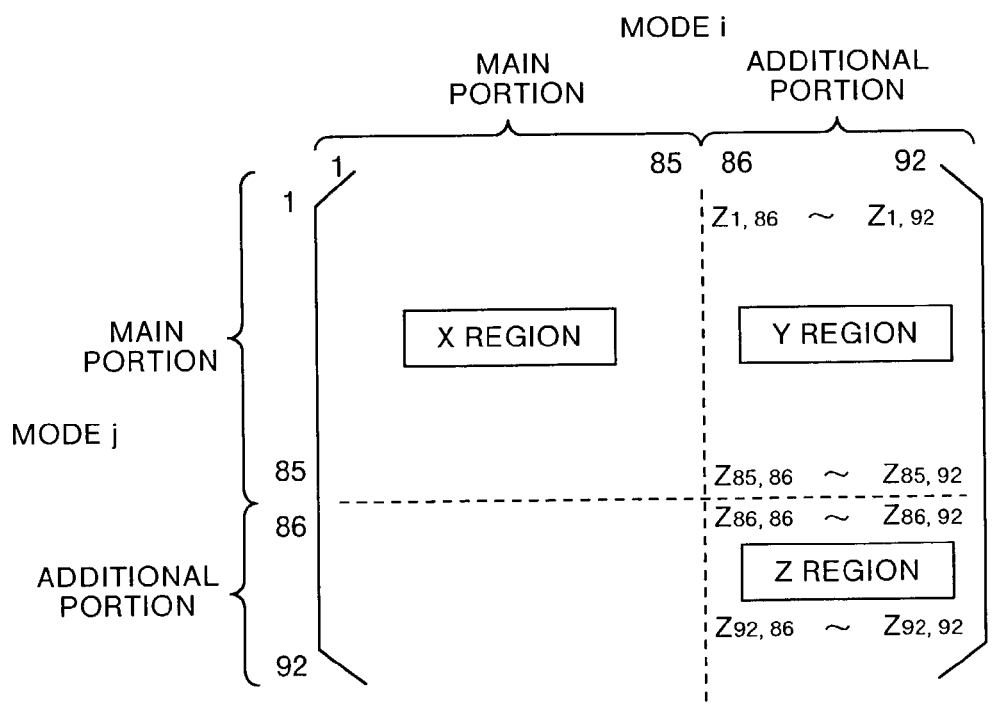

In the case of the model 210 shown in FIG. 9A, at step SB3, the mode i and the mode j of the main portion shown in FIG. 9B are set to 1 to 85. The mode i and the mode j (1 to 85) correspond to each dipole of the main portion 210a shown in FIG. 9A (not shown).

In the case of model 210, at step SB4, the mode i and the mode j of the additional portion shown in FIG. 9B are set to 86 to 92. The mode i and the mode j (86 to 92) correspond to each of the dipoles 86 to 92 of the additional portion 210b shown in FIG. 9A.

At step SB5 shown in FIG. 7, the frequency setting section 103 sets a predetermined frequency. At step SB6, the mutual immittance calculation section 104 respectively calculates each mutual immittance $Z_{i,j}$ (X region (main portion), Y region and Z region (additional portions)) in the mutual immittance matrix $[Z_{i,j}]$ (i=1 to 92, j=1 to 92) shown in FIG. 9B. In the mutual immittance matrix $[Z_{i,j}]$, the X region, Y region, and Z region respectively correspond to the X region, Y region, and Z region shown in FIG. 5.

At step SB7, the mutual immittance calculation section 104 stores the calculation result of the mutual immittance $Z_{i,j}$ of the main portion (X region) in the storage section 107. At step SB8, the current calculation section 105 calculates the current $I_i$ by solving the simultaneous equations $[Z_{i,j}] [I_i]=[V_i]$ (see FIG. 3) of the moment method. At step SB9, the electromagnetic-field strength calculation section 106 calculates the strength of the electromagnetic field emitted by the model 210, from the above calculation result. At step SB10, the output section 108 outputs the calculation result.

At step SA2 shown in FIG. 6, calculation processing for the second time onward is executed. Specifically, at step SC1 shown in FIG. 8, the input section 101 inputs the model data representing the model 210' (main portion 210a, additional portion 210b') shown in FIG. 10A.

In this model 210', the additional portion 210b shown in FIG. 9A is changed to the additional portion 210b', but the main portion 210a is not changed.

At step SC2, the mode setting section 102 creates an edge table for the model 210', in the same manner as at step SB2 (see FIG. 7).

Figure 10B:
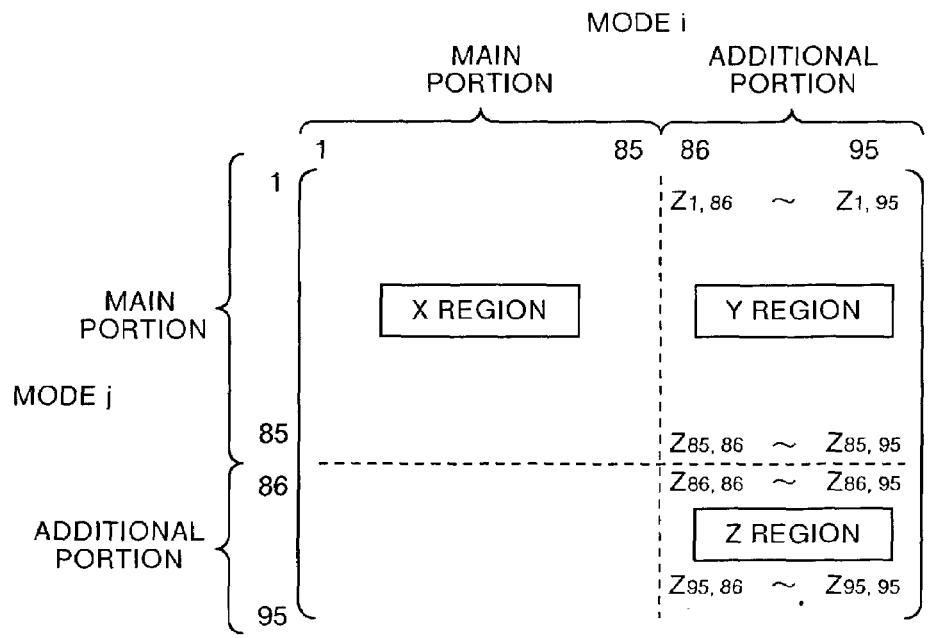

At step SC3, the mode setting section 102 sets the modes i and j of the main portion shown in FIG. 10B to 1 to 85, in the same manner as at step SB3 (see FIG. 7). The mode i and the mode j (1 to 85) correspond to each dipole (not shown) of the main portion 210a shown in FIG. 10A.

At step SC4, the mode setting section 102 sets the mode i and the mode j of the additional portion shown in FIG. 10B to 86 to 95, in the same manner as at step SB4 (see FIG. 7). The modes i and j (86 to 95) correspond to each of the dipoles 86 to 95 of the additional portion 210b' shown in FIG. 10A.

At step SC5, the frequency setting section 103 sets a predetermined frequency. At step SC6, the mutual immittance calculation section 104 reads the calculation result of the mutual immittance $Z_{i,j}$ of the main portion (X region) stored at step SB7, from the storage section 107.

At step SC7, the mutual immittance calculation section 104 respectively calculates each mutual immittance $Z_{i,j}$ (Y region and Z region (additional portions)) shown in FIG. 10B. The calculation result read in at step SC6 is used for the mutual immittance matrix $[Z_{i,j}]$ (X region) corresponding to the main portion shown in FIG. 10B.

At step SC8, the current calculation section 105 calculates the current $I_i$ by solving the simultaneous equations $[Z_{i,j}] [I_i]=[V_i]$ of the moment method (see FIG. 3). At step SC9, the electromagnetic-field strength calculation section 106 calculates the strength of the electromagnetic field emitted by the model 210', from the above calculation result. At step SC10, the output section 108 outputs the calculation result.

At step SA3 shown in FIG. 6, it is judged whether the change of the additional portion of the model is the final around, and if this judgment result is "No", that is, the additional portion of the model is further changed, the step SA2 is executed. When the judgment result at step SA3 is "Yes", a series of processing is finished.

As described above, according to this embodiment, at step SB7 (see FIG. 7), the calculation result of the mutual immittance corresponding to the main portion is stored in the storage section 107. As shown in FIG. 8, at step SC6, the stored calculation result is used for the calculation for the second time onward relating to the model in which only the additional portion is changed, to thereby recalculate the mutual immittance corresponding to the changed additional portion. As a result, the calculation amounts can be reduced, which makes it possible to calculate the mutual immittance and the electromagnetic-field strength at a high speed.

According to this embodiment, as explained with reference to FIG. 4C, in the boundary portion between the main portion and the additional portion, a combination of a monopole (patch) of the main portion and a monopole (patch) of the additional portion is designated as a combination of patches corresponding to the additional portion. As a result, the mutual immittance of the additional portion can be accurately calculated, while reducing the calculation amounts.

According to this embodiment, as explained with reference to FIG. 4A to FIG. 4C, calculation is performed on a dipole extending over two adjacent patches. As a result, the mutual immittance relating to the combination of a patch of the main portion and a patch of the additional portion can be accurately calculated as an additional portion.

Figures 13A, 13B:
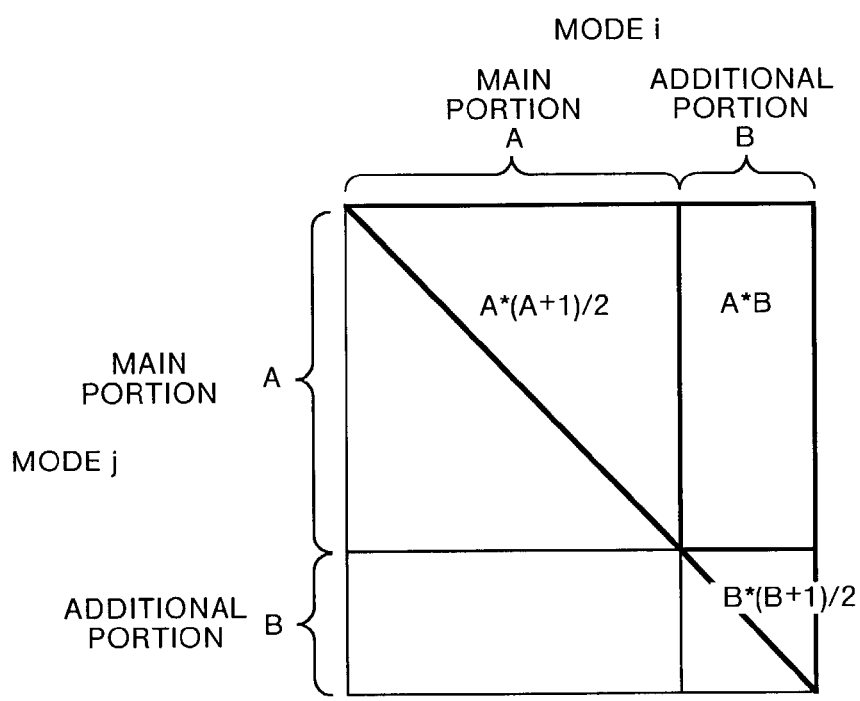
FIG. 13A and FIG. 13B are diagrams showing the effect due to the embodiment.

In the mutual immittance matrix $[Z_{i,j}]$ shown in FIG. 13A, when the number of the mode i and the mode j of the main portion is A and the number of the mode i and the mode j of the additional portion is B, the combination of elements at the time of the initial calculation is: $(A \cdot (A+1)/2 + A \cdot B + B \cdot (B+1)/2)$. On the other hand, the combination of elements for the second time onward is: $(A \cdot B + B \cdot (B+1)/2)$.

FIG. 13B shows an AB ratio (ratio of A to B) and a ratio between combination numbers (ratio of combinations for the first time around to combinations for the second time onward). As is seen from this figure, the combination number ratio decreases with an increase of the AB ratio. Hence, the calculation amounts decrease, which contributes to enhancement of high-speed calculation.

One embodiment according to the present invention has been explained in detail with reference to the drawings, but the specific example of the configuration is not limited to this embodiment, and any modifications that do not depart from the gist of the present invention are included in the present invention.

For example, in this embodiment, each function may be realized in a manner described below. That is, the program for realizing the functions of the electromagnetic-field strength calculation apparatus 100 is stored in a computer readable recording medium 400 shown in FIG. 14, and the program recorded in this recording medium 400 is loaded into and executed on a computer 300 shown in FIG. 14.

Figure 14:
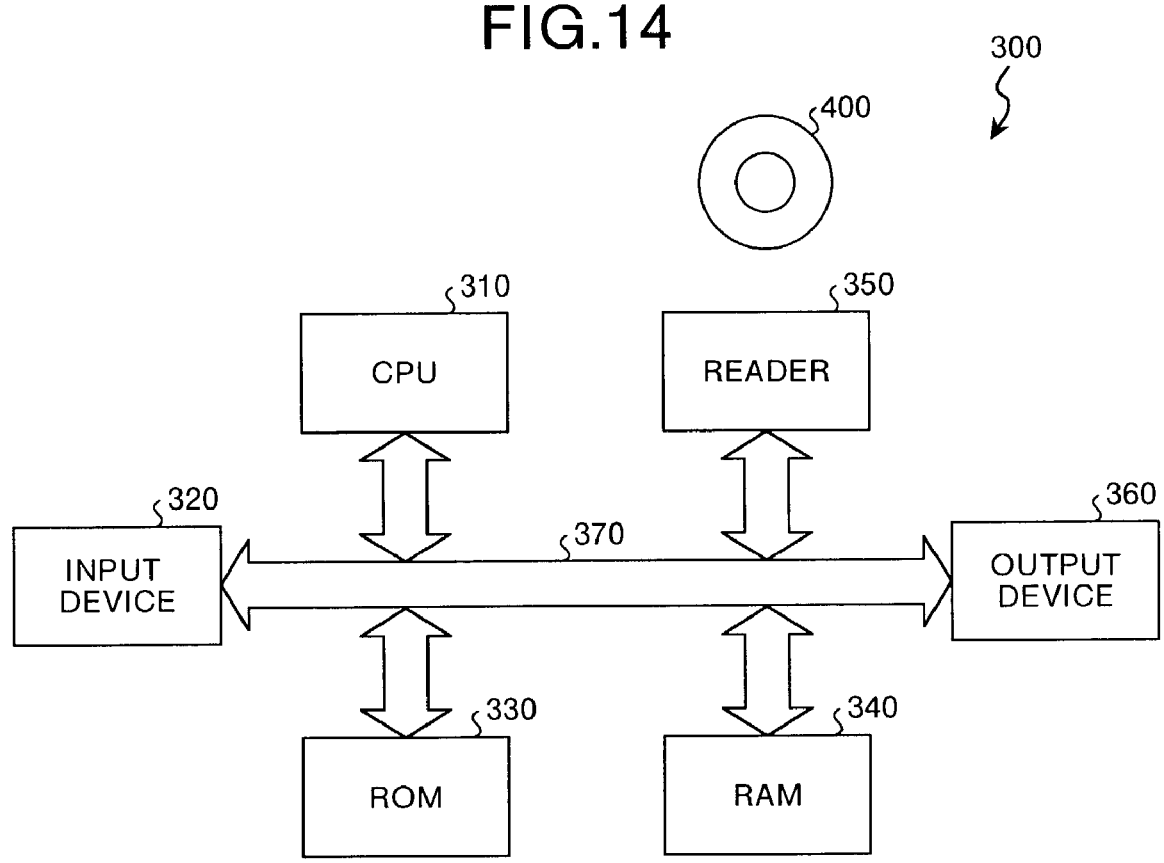
FIG. 14 is a block diagram showing the configuration of a modification example of the embodiment.

The computer 300 shown in FIG. 14 comprises a Central Processing Unit (CPU) 310 which executes the program, an input device 320 such as a keyboard and a mouse, a Read Only Memory (ROM) 330 which stores various data, a Random Access Memory (RAM) 340 which stores arithmetic parameters or the like, a reader 350 which reads the program from the recording medium 400, an output device 360 such as a display and a printer, and a bus 370 which connects each section of the computer.

The CPU 310 loads the program stored in the recording medium 400 via the reader 350, and executes the program to thereby realize the above-described functions. The recording medium 400 includes an optical disk, a flexible disk, and a hard disk.

According to one aspect of the present invention, the calculation result of the mutual immittance corresponding to the main portion is stored, and the stored calculation result is used when the model in which only the additional portion has been changed is calculated for the second time onward to recalculate the mutual immittance corresponding to the changed additional portion. Therefore, the calculation amounts can be reduced, thus enabling high-speed calculation of the mutual immittance.

According to another aspect, in the boundary portion between the main portion and the additional portion, a combination of a patch of the main portion and a patch of the additional portion is designated as a combination between patches corresponding to the additional portion. Therefore, it is possible to accurately calculate the mutual immittance of the additional portion while reducing the calculation amounts.

According to still another aspect, calculation is performed by designating a dipole extending over two adjacent patches as a target. Therefore, it is possible to accurately calculate the mutual immittance relating to the combination of a patch of the main portion and a patch of the additional portion as an additional portion.

According to still another aspect, the calculation result of the mutual immittance corresponding to the main portion is stored, and the stored calculation result is used when the model in which only the additional portion has been changed is calculated for the second time onward to recalculate the mutual immittance corresponding to the changed additional portion. The electromagnetic-field strength is then calculated based on the calculation result of the mutual immittance. Therefore, the calculation amounts can be reduced, thus enabling high-speed calculation of the mutual immittance and the electromagnetic-field strength.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A computer-readable recording medium that stores therein a computer program that causes a computer to execute a mutual immittance calculation, said calculation comprising:

inputting data of a model of an electric circuit apparatus, being a target for analysis of the electromagnetic-field strength and being divided into a plurality of patches having points at corners and edges connecting pairs of points;

discriminating a main portion from an additional portion in the patches;

creating a table representing correspondence between the edges, points and patches;

setting a mode, where the mode corresponds to a linear dimension of the electric circuit apparatus, for the main portion and the additional portion;

calculating the mutual immittance for combinations of patches corresponding to the main portion and calculating the mutual immittance for combinations of patches corresponding to the additional portion using the table; and storing a result of calculating the mutual immittance corresponding to the main portion, wherein when the mutual immittance calculation is made to the model in which only the additional portion has been changed for a second time onward, the mutual immittance corresponding to the changed additional portion is recalculated using the stored calculation result, and when the mutual immittance calculation is made in a boundary portion between the main portion and the additional portion is designated as a combination between patches corresponding to the additional portion.

2. The computer-readable recording medium according to claim 1, wherein the mutual immittance is calculated by designating a dipole extending over two adjacent patches as a target.

3. A mutual immittance calculation apparatus comprising:
a processor executing instructions to performing as
an input unit that inputs data of a model of an electric circuit apparatus, being a target for analysis of the electromagnetic-field strength and being divided into a plurality of patches having points at corners and edges connecting pairs of points;
a discrimination unit that discriminates a main portion from an additional portion in the patches;
a mode setting unit that sets a mode, where the mode corresponds to a linear dimension of the electric circuit apparatus, for the main portion and the additional portion;
a mutual immittance calculation unit that calculates the mutual immittance for combinations of patches corresponding to the main portion and calculating the mutual immittance for combinations of patches corresponding to the additional portion using the table; and
a storage unit that stores a result of calculating the mutual immittance corresponding to the main portion and a table representing the correspondence between the edges, points and patches, wherein the mutual immittance calculation unit uses the calculation result stored at the storage unit when the model in which only the additional portion has been changed is calculated for a second time onward, and recalculates the mutual immittance corresponding to the changed additional portion.

4. A mutual immittance calculation method comprising:
inputting data of a model of an electric circuit apparatus, being a target for analysis of the electromagnetic-field strength and being divided into a plurality of patches having points at corners and edges connecting pairs of points;
discriminating a main portion from an additional portion in the patches;
creating a table representing the correspondence between the edges, points and patches;
setting a mode, where the mode corresponds to a linear dimension of the electric circuit apparatus, for the main portion and the additional portion;
calculating the mutual immittance for combinations of patches corresponding to the main portion and calculating the mutual immittance for combinations of patches corresponding to the additional portion using the table; and
storing a result of calculating the mutual immittance corresponding to the main portion, wherein the mutual immittance calculating step includes using the calculation result stored at the storing step when the model in which only the additional portion has been changed is calculated for a second time onward, and recalculating the mutual immittance corresponding to the changed additional portion.

5. A computer-readable medium that stores therein a computer program that causes a computer to execute an electromagnetic-field strength calculation comprising:
inputting data of a model of an electric circuit apparatus, being a target for analysis of the electromagnetic-field strength and being divided into a plurality of patches having points at corners and edges connecting pairs of points;
discriminating a main portion from an additional portion in the patches;
creating a table representing the correspondence between the edges, points and patches;
setting a mode, where the mode corresponds to a linear dimension of the electric circuit apparatus, for the main portion and the additional portion;
calculating the mutual immittance for combinations of patches corresponding to the main portion and calculating the mutual immittance for combinations of patches corresponding to the additional portion using the table;
storing a result of calculating the mutual immittance corresponding to the main portion; and
calculating the electromagnetic-field strength, based on the calculation result of the mutual immittance, wherein
when the mutual immittance calculation is made to the model in which only the additional portion has been changed for a second time onward, the mutual immittance corresponding to the changed additional portion is recalculated using the stored calculation result.

6. The computer-readable recording medium according to claim 5, wherein when the mutual immittance calculation is made in a boundary portion between the main portion and the additional portion, a combination of a patch of the main portion and a patch of the additional portion is designated as a combination between patches corresponding to the additional portion.

7. The computer-readable recording medium according to claim 5, wherein the mutual immittance is calculated by designating a dipole extending over two adjacent patches as a target.

8. The mutual immittance calculation method of claim 4 wherein calculating the mutual immittance uses a moment method of calculation to calculate the main portion and the additional portion.

* * * * *